(12) United States Patent
Park et al.

(10) Patent No.: US 9,166,607 B2
(45) Date of Patent: Oct. 20, 2015

(54) CAPACITOR LEAKAGE COMPENSATION FOR PLL LOOP FILTER CAPACITOR

(75) Inventors: Sunghyun Park, Santa Clara, CA (US); Shen Wang, Santa Clara, CA (US); Young Gon Kim, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 27 days.

(21) Appl. No.: 13/409,348

(22) Filed: Mar. 1, 2012

(65) Prior Publication Data
US 2013/0229213 A1 Sep. 5, 2013

(51) Int. Cl.
H03L 7/06 (2006.01)
H03L 7/089 (2006.01)
H03L 7/093 (2006.01)

(52) U.S. Cl.
CPC .............. *H03L 7/0891* (2013.01); *H03L 7/093* (2013.01)

(58) Field of Classification Search
USPC ......................................................... 327/157
See application file for complete search history.

(56) References Cited

U.S. PATENT DOCUMENTS

| | | | | |
|---|---|---|---|---|
| 5,659,588 | A * | 8/1997 | Fiedler ........................... | 375/376 |
| 5,933,037 | A * | 8/1999 | Momtaz ......................... | 327/157 |
| 6,861,898 | B2 | 3/2005 | Hsu et al. | |
| 6,956,417 | B2 * | 10/2005 | Bernstein et al. ............. | 327/157 |
| 6,963,232 | B2 * | 11/2005 | Frans et al. .................... | 327/156 |
| 7,049,866 | B2 | 5/2006 | Wilson | |
| 7,078,977 | B2 * | 7/2006 | Maneatis ......................... | 331/16 |
| 7,132,865 | B1 | 11/2006 | Terrovitis et al. | |
| 7,248,086 | B2 * | 7/2007 | Frans et al. .................... | 327/147 |
| 7,310,021 | B2 * | 12/2007 | Familia ............................ | 331/17 |
| 7,365,593 | B1 * | 4/2008 | Swanson ........................ | 327/536 |
| 7,888,990 | B1 * | 2/2011 | Bazes .............................. | 327/536 |
| 8,125,254 | B1 * | 2/2012 | Ding ............................... | 327/156 |
| 2005/0110535 | A1 * | 5/2005 | Bernstein et al. .............. | 327/156 |
| 2005/0189973 | A1 * | 9/2005 | Li ................................... | 327/157 |
| 2005/0248412 | A1 | 11/2005 | Boerstler et al. | |
| 2008/0008284 | A1 | 1/2008 | Huang et al. | |
| 2008/0136492 | A1 | 6/2008 | Hu | |
| 2009/0121759 | A1 * | 5/2009 | Wang et al. .................... | 327/157 |

(Continued)

FOREIGN PATENT DOCUMENTS

GB 2473179 A 3/2011

OTHER PUBLICATIONS

International Search Report and Written Opinion—PCT/US2013/028711—ISA/EPO—Jul. 31, 2013.

*Primary Examiner* — Lincoln Donovan
*Assistant Examiner* — Patrick Chen
(74) *Attorney, Agent, or Firm* — Peter Clevenger

(57) ABSTRACT

An output portion of a charge pump receives control signals from a phase frequency detector and in response outputs positive current pulses and negative current pulses to a loop filter. A current control portion of the charge pump controls the output portion such that the magnitudes of the positive and negative current pulses are the same. Within the current control portion there is a "Charge Pump Output Voltage Replica Node" (CPOVRN). The voltage on this CPOVRN is maintained to be the same as a voltage on the charge pump output node. A capacitor leakage compensation circuit indirectly senses the voltage across a leaking capacitor of the loop filter by sensing the voltage on the CPOVRN. The compensation circuit imposes the sensed voltage across a replica capacitor, mirrors a current leaking through the replica, and supplies the mirrored current in the form of a compensation current to the leaking capacitor.

26 Claims, 8 Drawing Sheets

(56) References Cited

U.S. PATENT DOCUMENTS

| | | |
|---|---|---|
| 2010/0001771 A1 | 1/2010 | Liu et al. |
| 2011/0018597 A1* | 1/2011 | Lee et al. .................... 327/156 |
| 2011/0140767 A1 | 6/2011 | Lin |
| 2012/0256693 A1* | 10/2012 | Raghunathan et al. ......... 331/34 |

* cited by examiner

VTUNE RIPPLE FOR A PLL USING A THICK OXIDE
MOSCAP AND NO COMPENSATION CIRCUIT

VTUNE RIPPLE FOR THE PLL OF FIG. 3
(THIN OXIDE MOSCAP AND THE COMPENSATION CIRCUIT OF FIG. 4)

PHASE NOISE FOR A PLL USING A THICK OXIDE
MOSCAP AND NO COMPENSATION CIRCUIT

PHASE NOISE FOR THE PLL OF FIG. 3
(THIN OXIDE MOSCAP AND THE COMPENSATION CIRCUIT OF FIG. 4)

CAPACITOR LEAKAGE COMPENSATION FOR PLL LOOP FILTER CAPACITOR

BACKGROUND INFORMATION

1. Technical Field

The present disclosure relates to capacitor leakage compensation circuits in Phase-Locked Loops (PLLs).

2. Background Information

The loop filter of a Phase-Locked Loop (PLL) may involve a capacitor having a relatively large capacitance. Realizing this capacitor in integrated circuit form may consume an undesirably large amount of area on the integrated circuit. The capacitor may be implemented in different ways. If the capacitor is implemented in one way, then the capacitor will occupy a larger amount of integrated circuit area but will leak only to a small degree. On the other hand, if the capacitor is implemented in another way then the capacitor may occupy a smaller amount of integrated circuit area but will leak to a larger degree. In some cases, the capacitor is implemented as the relatively small but leaky capacitor, but then a capacitor leakage compensation circuit is provided. The capacitor leakage compensation circuit includes a small version of the leaking capacitor that is referred to as a "replica" capacitor. How the larger capacitor and the replica capacitors leak as a function of voltage is the same, only the replica capacitor leaks less in proportion to how much smaller it is than the larger capacitor. The capacitor leakage compensation circuit operates to maintain a voltage across the replica capacitor that is the same as the voltage across the leaking capacitor of the loop filter when the loop filter is operating. The capacitor leakage compensation circuit, however, detects the current that leaks through the replica capacitor. Because the relationship in size between the replica capacitor and the leaking capacitor in the loop filter is known, the compensation circuit operates to supply a multiple of the detected amount of leakage current onto the leaking capacitor in the loop filter. Ideally, the magnitude of this compensation current is the same as the magnitude of the current leaking through the leaking capacitor of the loop filter. Such a capacitor leakage current compensation circuit allows the capacitor of the loop filter to be realized as the smaller type of capacitor that is relatively leaky, thereby saving integrated circuit area as compared to the size that the loop filter would have were the loop filter implemented using the larger type of capacitor that leaks less. The overall amount of integrated circuit area consumed, the overall amount of current consumption, and the performance of the combination of the leaking capacitor and the compensation circuit should be preferable to the alternative amount of integrated circuit area, current consumption, and performance of the loop filter had the loop filter been implemented with the larger but less leaky capacitor.

A first example of a capacitor leakage compensation circuit is set forth in FIG. 10 of U.S. Pat. No. 6,956,417. This capacitor leakage compensation circuit 190 may be part of a phase-locked loop involving a phase detector, a charge pump, a loop filter, a Voltage Controlled Oscillator, and a loop divider. Resistor $R_{REF}$ and capacitor C1 make up the loop filter. Capacitor C1 is the leaking capacitor. Capacitor C4 is the replica capacitor. The voltage $V_C$ is the voltage across the leaking capacitor. The capacitor leakage compensation circuit 190 senses this voltage and supplies a compensation current back onto this same node $V_C$. This circuit is an example of what is sometimes referred to as a "direct sensing" circuit because it senses the voltage on the leaking capacitor itself.

A second example of a capacitor leakage compensation circuit is set forth in

FIG. 4 of U.S. Pat. No. 6,963,232. Reference numeral 54 identifies the leaking capacitor. Current 57 is the current that leaks through capacitor 54. Capacitor 59 is the replica capacitor. The leakage compensation circuit 39 senses the voltage across the leaking capacitor indirectly at the input of VCO 42, places this voltage across the replica capacitor, detects a current 70 that leaks through the replica capacitor, and supplies a multiple of the detected leaking current onto node 67 in the form of a compensation current 58. Compensation current 58 compensates for the current 57 that leaks through capacitor 54 to ground. This circuit is an example of "indirect sensing" in that the leakage compensation circuit senses the voltage on the leaking capacitor indirectly.

SUMMARY

A Phase-Locked Loop (PLL) includes a Phase Frequency Detector (PFD), a

Charge Pump (CP), a loop filter, a Voltage Controlled Oscillator (VCO), a loop divider, and a capacitor leakage compensation circuit. The charge pump includes a current control portion and an output portion. The output portion receives control signals from the PFD and in response outputs positive current pulses and negative current pulses to the loop filter via a charge pump output node. The current control portion controls the output portion such that the magnitude of the positive current pulses and the magnitude of the negative current pulses are the same. Within the current control portion there is a node referred to here as the "Charge Pump Output Voltage Replica Node" (CPOVRN). A replica of the voltage on the charge pump output node is present on the CPOVRN. In one example, an operational amplifier within the current control portion operates to keep the voltage on this CPOVRN substantially equal to the voltage on the charge pump output node.

The loop filter receives the positive current pulses and the negative current pulses from the charge pump output node, filters these pulses, and supplies the resulting control voltage signal VTUNE onto a control input lead of the VCO. There is a relatively large capacitor in the loop filter. This large capacitor experiences substantial leakage when the PLL is in operation. In one example, this leaking capacitor of the loop filter is a thin oxide metal oxide semiconductor capacitor (MOSCAP). The capacitor leakage compensation circuit detects the voltage across this leaking capacitor indirectly by sensing the voltage on the CPOVRN within the current control portion of the charge pump. The capacitor leakage compensation circuit imposes the sensed voltage across a replica capacitor, where the replica capacitor is a replica of the leaking capacitor of the loop filter, except that the replica capacitor is of substantially smaller size and capacitance. A current leaks through the replica capacitor. This leakage current is supplied to a current mirror of the capacitor leakage compensation circuit so that the current mirror outputs a multiple of the replica capacitor leakage current in the form of a compensation current. The compensation current is supplied onto a node at the plate of the leaking capacitor of the loop filter. The compensation current supplied onto the plate of the leaking capacitor of the loop filter is substantially equal to the current leaking through the leaking capacitor of the loop filter.

The loop filter further includes two passive low pass filters. These two low pass filters are coupled in series between the node at the plate of the leaking capacitor and the control input lead of the VCO. Unwanted noise passing from the current mirror of the capacitor leakage compensation circuit through the loop filter to the control input lead of the VCO is attenuated by virtue of having to pass through these two low pass filters. There also may be unwanted noise that passes from the input of the capacitor leakage compensation circuit, back through the charge pump, through the charge pump output node, through the loop filter, and to the control input of the VCO. In one example, noise in this path is attenuated by the operational amplifier of the charge pump (the operational amplifier that operates to keep the sense voltage on CPOVRN the same as the voltage on the charge pump output node) and by one of the low pass filters of the loop filter.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
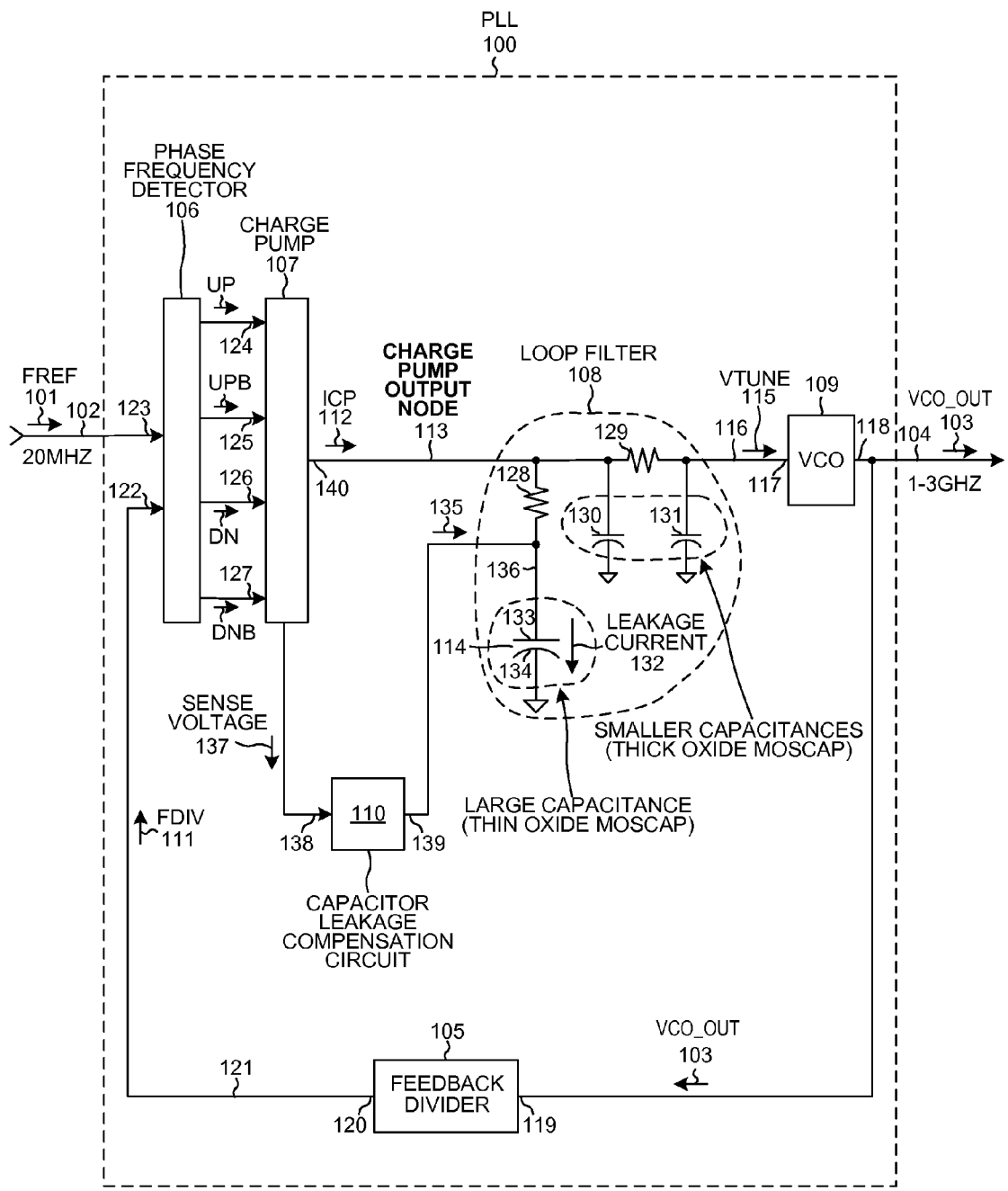
FIG. 1 is a diagram of an analog Phase-Locked Loop (PLL) in accordance with one novel aspect.

FIG. 1 is a diagram of an analog Phase-Locked Loop (PLL) 100 that is integrated onto a single integrated circuit in accordance with one novel aspect. PLL 100 receives a reference clock signal FREF 101 on conductor 102 and outputs an output signal VCO_OUT 103 on conductor 104. The frequency of the output signal VCO_OUT is a desired integer multiple of the frequency of the input signal FREF 101. By changing the integer by which feedback divider 105 divides, the frequency of the output signal VCO_OUT 103 can be varied in a range of from about 1 GHz to about 3 GHz. PLL 100 includes a Phase Frequency Detector (PFD) 106, a Charge Pump (CP) 107, a loop filter 108, a Voltage Controlled Oscillator (VCO) 109, the feedback divider 105, and a capacitor leakage compensation circuit 110. PFD 106 compares the time of an edge of a feedback signal FDIV 111 to the time of an edge of the input signal FREF 101 and outputs control signals UP, UPB, DN and DNB. The control signals are indicative of the relative time difference between the two edges.

For example, if PFD 106 detects that the edge of feedback signal FDIV 111 follows the edge of input signal FREF 101, then the control signals UP, UPB, DN and DNB are asserted during the time between the edges. The longer the time difference between the edges of FDIV 111 and FREF 101, the longer the time that the control signals UP, UPB, DN and DNB are asserted. Charge pump 107 converts the asserted control signals into a corresponding positive pulse of current ICP 112 that is output onto charge pump output node 113.

For example, if PFD 106 detects that the edge of feedback signal FDIV 111 is ahead of the edge of input signal FREF 101, then the control signals UP, UPB, DN and DNB are generated during the time between the edges of FDIV 111 and FREF 101 such that charge pump 107 is controlled to draw a pulse of current ICP 112 from charge pump output node 113. Drawing a pulse of current from node 113 is the same thing as supplying a negative pulse of current onto node 113.

These positive pulses of current and negative pulses of current are integrated on capacitor 114 (and capacitors 130 and 131) of loop filter 108 such that a relatively slow changing control signal VTUNE 115 is generated onto node 116 at the output of the loop filter. VTUNE 115 is supplied onto a control input lead 117 of VCO 109. VCO 109 generates the oscillating output signal VCO_OUT 103 onto output lead 118. The frequency of the signal VCO_OUT is determined by the level of VTUNE 115. Raising the level of VTUNE causes the VCO to increase the frequency of signal VCO_OUT 103, whereas lowering the level of VTUNE causes the VCO to decrease the frequency of signal VCO_OUT 103. The signal VCO_OUT 103 is supplied to the input lead 119 of feedback divider 105. Feedback divider 105 frequency divides the VCO_OUT signal by an integer divisor and outputs the resulting lower frequency signal FDIV 111 from its output lead 120. Feedback signal FDIV 111 is supplied via conductor 121 to the second input lead 122 of PFD 106. PFD 106 receives the input reference signal FREF 101 on the first input lead 123 of PFD 106. When PLL 100 is in lock, the frequency and phase of FDIV signal 111 is locked to the frequency and phase of FREF signal 101.

Loop filter 108 receives the positive and negative pulses of current ICP 112 from charge pump 107 via charge pump output node 113 and outputs the resulting filtered signal VTUNE 115 onto node 116. Loop filter 108 includes, in addition to large capacitor 114, two resistors 128 and 129, and two smaller capacitors 130 and 131. In one example, the PLL has a loop bandwidth of less than 100 kHz, the capacitors 114, 130 and 131 have capacitances of 500 pF, 20 pF and 10 pF, respectively, and the resistors 128 and 129 have resistances of 40 k ohms and 20 k ohms, respectively. Resistor 128 is coupled between the charge pump output node 113 and large capacitor 114 as illustrated. Resistor 128 has a first lead that is directly connected to the charge pump output node 113 and it has a second lead that is directly connected to large capacitor 114.

In the present example, large capacitor 114 is realized as an on-chip metal oxide semiconductor capacitor (MOSCAP) having a thin oxide. The capacitance is formed between the gate metal of the MOSCAP, and a space charge depletion region in the underlying semiconductor material. Capacitors 130 and 131, on the other hand, are capacitors that have much smaller capacitances than capacitor 114. These capacitors 130 and 131 are also realized as MOSCAP capacitors, but due to their smaller capacitances, they are realized as thick oxide MOSCAPs without sacrificing too much integrated circuit area. In the present example, a thin oxide MOSCAP of a given capacitance will consume about half the integrated circuit area that a thick oxide MOSCAP of the same capacitance will consume, but the thin oxide MOSCAP capacitor will exhibit higher current leakage as compared to the thick oxide MOSCAP capacitor. The voltage V1 across capacitor 114 increases and decreases as the PLL control loop operates to keep the phase of FDIV signal 111 in lock with the phase of FREF signal 101. For a given voltage across capacitor 114, however, the capacitor 114 will leak a leakage current 132 from its first plate 133 to its second plate 134. As the voltage V1 across capacitor 114 changes, this leakage current 132 changes, but the capacitor 114 always leaks. Without leakage compensation, the constant leakage of current through capacitor 114 may adversely affect PLL operation by making VTUNE improperly low. But as the PLL control loop operates, the control loop attempts to compensate for the leaking and this compensation manifests itself as a VTUNE voltage that increases. VTUNE is seen to increase and decrease about the proper VTUNE value rather than being a fixed value as desired. The resulting variation (referred to as ripple) in VTUNE causes a corresponding undesirable additional frequency component in the PLL output signal. Capacitor leakage compensation circuit 110 therefore operates to supply a compensation current 135 onto node 136 to compensate for the leakage current 132 leaking from node 136 through capacitor 114 to ground. Capacitor leakage compensation circuit 110 detects the voltage across capacitor 114 indirectly by sensing a sense voltage 137 present on a "Charge Pump Output Voltage Replica Node" (CPOVRN) within the charge pump 107 as is explained in further detail below. The sense voltage 137 from the CPOVRN is indicative of the voltage V1 across capacitor 114. Capacitor leakage compensation circuit 110 receives the sense voltage 137 onto its input 138 and uses the sense voltage 137 to control the magnitude of the compensation current 135 supplied via output 139 onto node 136.

Figure 2:
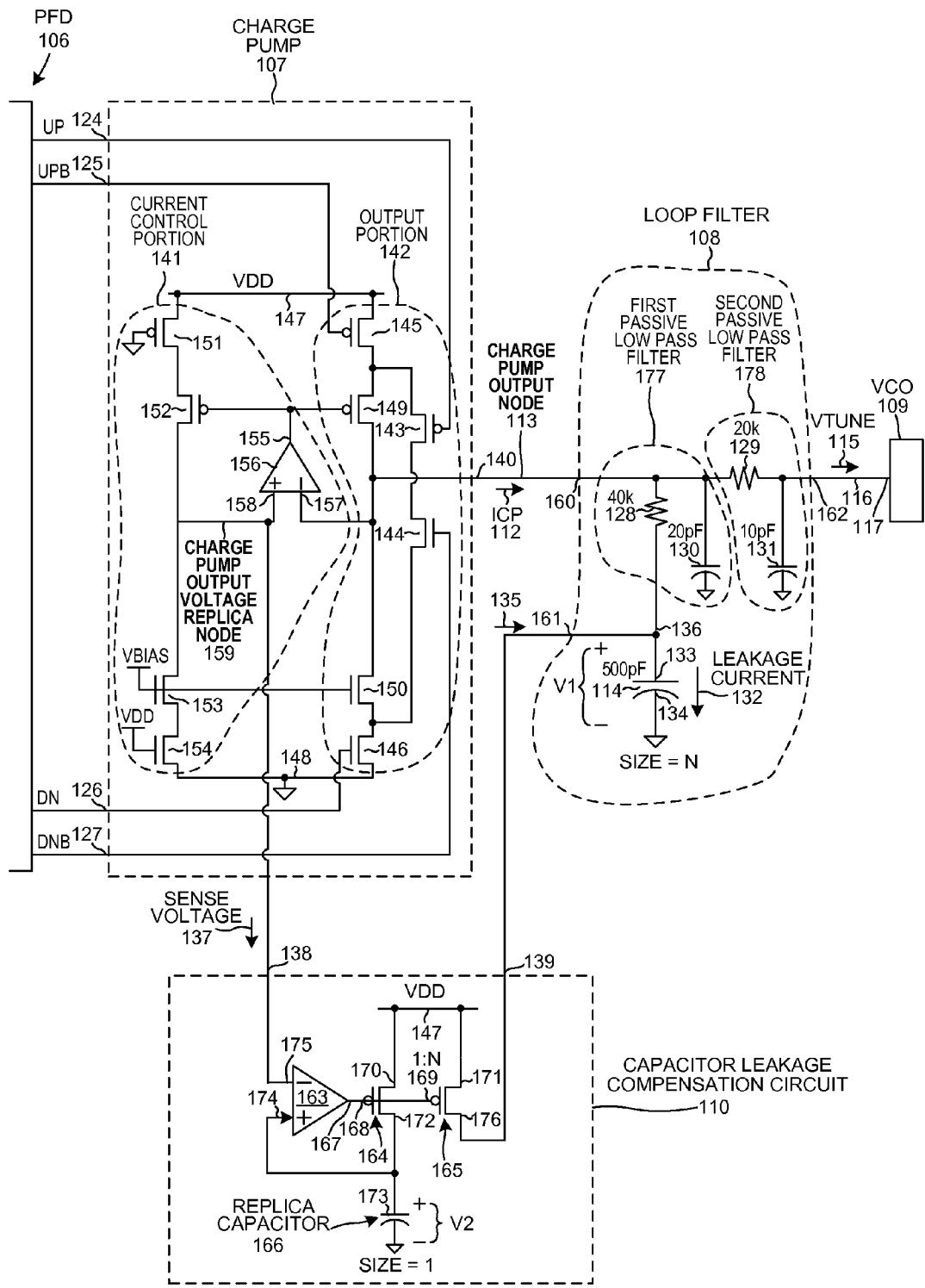
FIG. 2 is a diagram that shows the charge pump, loop filter and capacitor leakage compensation circuit of the PLL of FIG. 1 in further detail. .

FIG. 2 is a diagram that shows charge pump 107, loop filter 108 and capacitor leakage compensation circuit 110 in further detail. Charge pump 107 includes a current control portion 141 and an output portion 142. Charge pump 107 receives the control signals UP, UPB, DN and DNB from PFD 106 via input leads 124-127, respectively. Charge pump 107 outputs current pulses from charge pump output lead 140.

At times when PFD 106 is not asserting the control signals, the signal UP will be at a digital logic low, the signal UPB will be at a digital logic high, the signal DN will be at a digital logic low, and the signal DNB will be at a digital logic high. P-channel field effect transistor 143 will therefore be on and N-channel field effect transistor 144 will be on. P-channel transistor 145 will be off. N-channel transistor 146 will be off. Any current path from VDD supply voltage conductor 147 through transistor 145 to the charge pump output node 113 will be broken, as will any current path from ground conductor 148 through transistor 146 to the charge pump output node 113. Charge pump 107 is neither charging nor discharging capacitances on node 113 during such times.

At times when PFD 106 is asserting a control signal to generate a positive current pulse ICP, the signal UP will be at a digital logic high, the signal UPB will be at a digital logic low, the signal DN will be at a digital logic low, and the signal DNB will be at a digital logic high. P-channel transistor 145 will therefore be on and N-channel transistor 146 will be off Transistor 143 will be off Accordingly, a current path is established from supply conductor 147, through transistor 145, through transistor 149 and to node 113. The degree to which P-channel transistor 149 is on and conductive determines the magnitude of the positive current pulse ICP. The degree to which P-channel transistor 149 is conductive is determined by the voltages on the gate, source and drain of transistor 149, and these voltages are controlled by the current control portion 141. The duration of the positive current pulse ICP is determined by the time difference between the edges of signal FDIV 111 and signal FREF 101 that gave rise to the asserting of the control signals UP, UPB, DN and DNB.

At times when PFD 106 is asserting a control signal to generate a negative current pulse ICP, the signal DN will be at a digital logic high, the signal DNB will be at a digital logic low, the signal UP will be at a digital logic low, and the signal UPB will be at a digital logic high. N-channel transistor 146 will be on and P-channel transistor 145 will be off Transistor 144 will be off Accordingly, a current path is established from node 113, through transistor 150, through transistor 146, and to ground conductor 148. The degree to which N-channel transistor 150 is conductive determines the magnitude of the negative current pulse ICP. The degree to which N-channel transistor 150 is conductive is determined by the voltages on the gate, source and drain of transistor 150, and these voltage are determined by the current control portion 141. The duration of the negative current pulse ICP is determined by the time difference between the edges of signal FDIV 111 and signal FREF 101 that gave rise to the asserting of the control signals UP, UPB, DN and DNB.

The current control portion 141 of the charge pump 107 includes transistors 151-154 and operational amplifier 156. The transistors 151-154 form a current path from VDD conductor 147, through the "Charge Pump Output Voltage Replica Node" (CPOVRN) 159, and to ground conductor 148. The transistors 151-154 correspond to transistors 145, 149, 150 and 146 of the output portion 142, except that P-channel transistor 151 is connected to be always on and N-channel transistor 154 is connected to be always on. The gate of transistor 153 of the current control portion 141 and the gate of N-channel transistor 150 of the output portion 142 are supplied with a bias voltage VBIAS. This VBIAS voltage largely determines the conductivity of transistor 150 and therefore sets the magnitude of the negative current pulses generated by the charge pump.

There is very little current flow into or out of the high impedance input lead 158 of operational amplifier 156. The source-to-drain current flow through P-channel transistor 152 is therefore the same as the current flowing through N-channel transistor 153. It is desired to copy this current over to the output portion 142 so that this same amount of current will flow through P-channel transistor 149 if transistor 145 is on, and so that this same amount of current will flow through N-channel transistor 150 if transistor 146 is on. If the source, gate and drain voltages of P-channel transistor 149 are the same as the corresponding source, gate and drain voltages of P-channel transistor 152, then this current copying will occur. The gates of transistors 152 and 149 are therefore coupled together and to the output lead 155 of operational amplifier 156 so that their gate voltages are the same. The voltage drop across fully-on P-channel transistor 151 is very small, as is the voltage drop across fully-on P-channel transistor 145 when transistor 145 is controlled to be on. Accordingly, the source voltages of transistors 152 and 149 are essentially the same (at a voltage close to supply voltage VDD). Operational amplifier 156 operates to maintain the drain voltage on transistor 149 the same as the drain voltage on transistor 152. When operational amplifier 156 is operating in a negative feedback loop, the voltages on its inverting input lead 157 and its noninverting input lead 158 are substantially identical. Because the source, gate and drain voltages of transistor 149 are the same as the source, gate and drain voltages of transistor 152, the two transistors 152 and 149 are identically biased and the current flowing through the current control portion 141 is copied to flow through transistor 149 in the output portion 142. In the same way, the gate, source and drain voltages of N-channel transistor 150 are the same as the corresponding gate, source and drain voltages of N-channel transistor 153. Accordingly, when transistor 146 is on the current flow through transistor 150 of the output portion 142 of the charge pump is the same as the current flow through transistor 153 of the current control portion 141 of the charge pump. The current control portion 141 of the charge pump therefore controls transistors 149 and 150 such that the magnitudes of the positive current pulses ICP are the same as the magnitudes of the negative current pulses ICP. Increasing VBIAS increases the magnitude of both positive and negative pulses of ICP 112. Decreasing VBIAS decreases the magnitude of both positive and negative pulses of ICP 112. VBIAS in the present example is a fixed voltage but in other examples it may be variable.

Loop filter 108 can be considered to have two inputs 160 and 161 and one output 162. Loop filter 108 includes two passive RC low pass filters 177 and 178 as illustrated. Resistor 128 and capacitor 130 form the first passive RC low pass filter 177. Resistor 129 and capacitor 131 form the second passive RC low pass filter 178. The two passive RC low pass filters 177 and 178 are coupled together in series between node 136 and the input lead 117 of VCO 109. Noise generated by capacitor leakage compensation circuit 110 onto node 136 must pass through both of these two passive RC low pass filters 177 and 178 in order to reach the control input lead 117 of VCO 109.

Capacitor leakage compensation circuit 110 has an input 138 through which it receives the sense voltage 137 from CPOVRN node 159 in the charge pump 107. Capacitor leakage compensation circuit 110 has an output 139 from which it supplies the compensation current 135 onto the plate 133 of capacitor 114 of the loop filter. Capacitor leakage compensation circuit 110 includes an operational amplifier 163, two P-channel field effect transistors 164 and 165, and a replica capacitor 166 interconnected as illustrated. The output lead 167 of operational amplifier 163 is coupled to the gate 168 of transistor 164 and to the gate 169 of transistor 165. The source 170 of transistor 164 and the source 171 of transistor 165 are both coupled to VDD supply conductor 147. The drain 172 of transistor 164 is coupled to a plate 173 of replica capacitor 166 and to the noninverting input lead 174 of operational amplifier 163 so that the voltage on the inverting input lead 175 of operational amplifier 163 will be maintained across the replica capacitor 166. The voltage imposed across the replica capacitor 166 is denoted voltage V2. Transistors 164 and 165 form a current mirror. The current flowing through transistor 165 is mirrored to be N times as large as the current flowing through transistor 164. N is in a range of from about twenty to about thirty, and in the present example is twenty-one. Replica capacitor 166 is one Nth as large as the leaking capacitor 114 of the loop filter, so replica capacitor 166 leaks one Nth as much current as does capacitor 114, provided that the same voltage is present across both capacitors, and provided that both capacitors have the same thin oxide MOSCAP structure. The current that leaks through replica capacitor 166 is conducted through transistor 164 of the current mirror. Due to operation of the current mirror, N times this replica capacitor leakage current is made to flow from the drain 176 of transistor 165 to node 136 in the form of compensation current 135.

Figure 3:
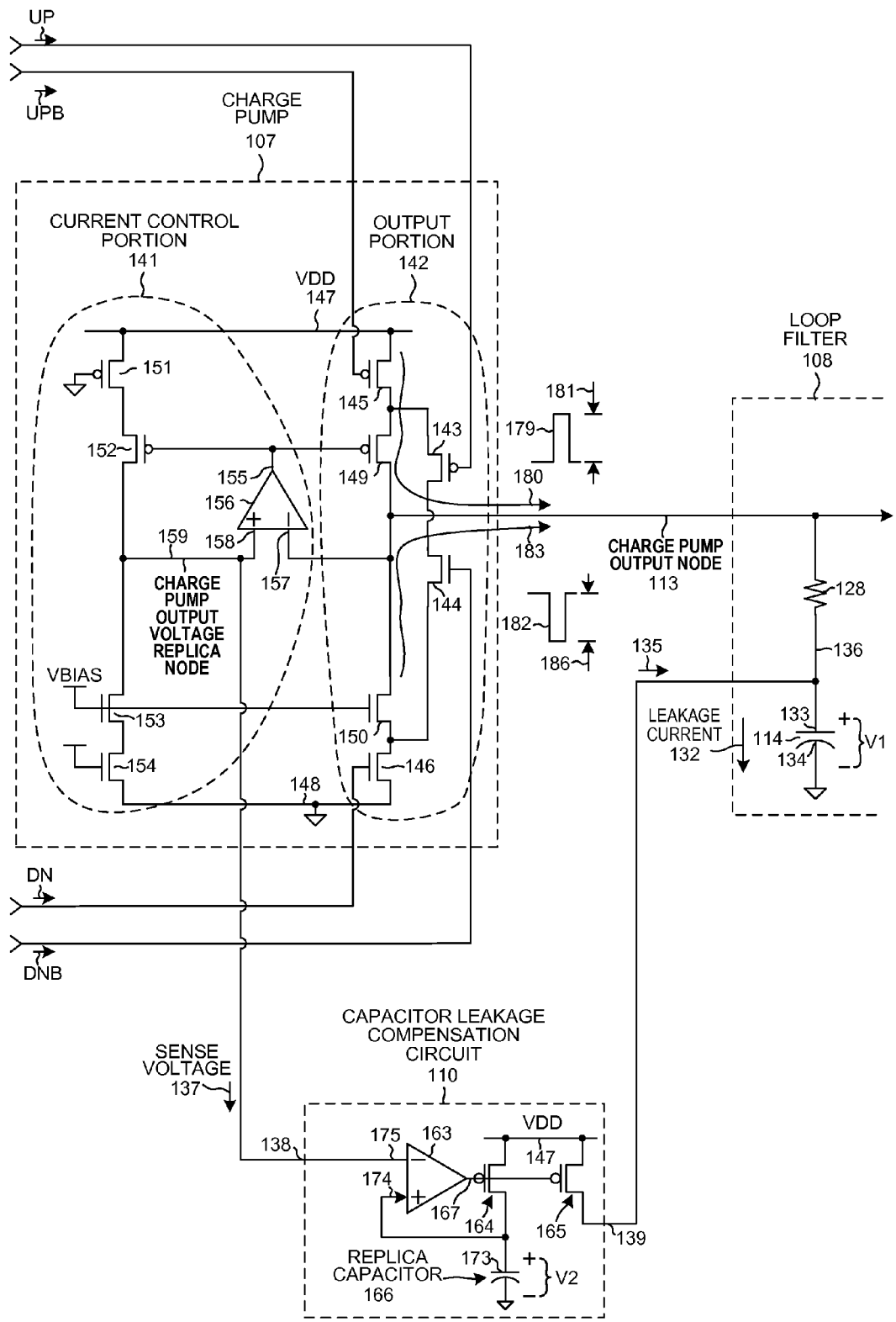
FIG. 3 is another diagram of the charge pump and the capacitor leakage compensation circuit of the PLL of FIG. 1.

FIG. 3 is another diagram of charge pump 107, capacitor leakage compensation circuit 110, and a part of loop filter 108. The diagram of FIG. 3 shows a positive current pulse 179 of current ICP 112. Positive current pulse 179 flows through the current path indicated by arrow 180. The magnitude 181 of this current pulse 179 is determined by the current control portion 141 of the charge pump as explained above. The diagram also shows a negative current pulse 182 of current ICP 112. Although arrow 183 indicates that the path of this pulse extends from ground conductor 148 to node 113, the pulse is understood to be a negative pulse of current. The direction of actual current flow is from node 113 to ground conductor 148. The magnitude 186 of negative current pulse 182 is determined by the current control portion 141 of the charge pump as explained above.

Capacitor leakage compensation circuit 110 indirectly senses the voltage V1 across capacitor 114 as follows. During steady state operation there is very little current flow across resistor 128. The voltage on charge pump output node 113 is therefore very close to the voltage on node 136. When operational amplifier 156 is operating in steady state operation, there is very little voltage difference between the voltages on the two input leads 157 and 158 of the operational amplifier 156. Operational amplifier operates to maintain the voltage on its noninverting input lead 158 at the same voltage present on its inverting input lead 157. Node 159 is therefore referred to as the "Charge Pump Output Voltage Replica Node" (CPOVRN) 159 in that the voltage on this node is a replica of the voltage on the charge pump output node 113. In accordance with one novel aspect, CPOVRN 159 is directly connected to the inverting input lead 175 of operational amplifier 163 of capacitor leakage compensation circuit 110. Capacitor leakage compensation circuit 110 senses the voltage V1 across capacitor 114 indirectly by sensing the sense voltage 137 on CPOVRN 159. The sensing input lead of operational amplifier 163 of capacitor leakage compensation circuit 110 is not directly connected to the control input lead 117 of the VCO 109, nor is it directly connected to node 136 at the leaking capacitor 114, nor is it directly connected to any other node in the loop filter, nor is it directly connected to the output of the charge pump at node 113. The indirect sensing of the voltage V1 across leaking capacitor 114 by sensing the voltage present on CPOVRN 159 in the current control portion 141 of charge pump 107 has advantages over the prior art circuits of U.S. Pat. No. 6,956,417 and 6,963,232.

Figure 4:
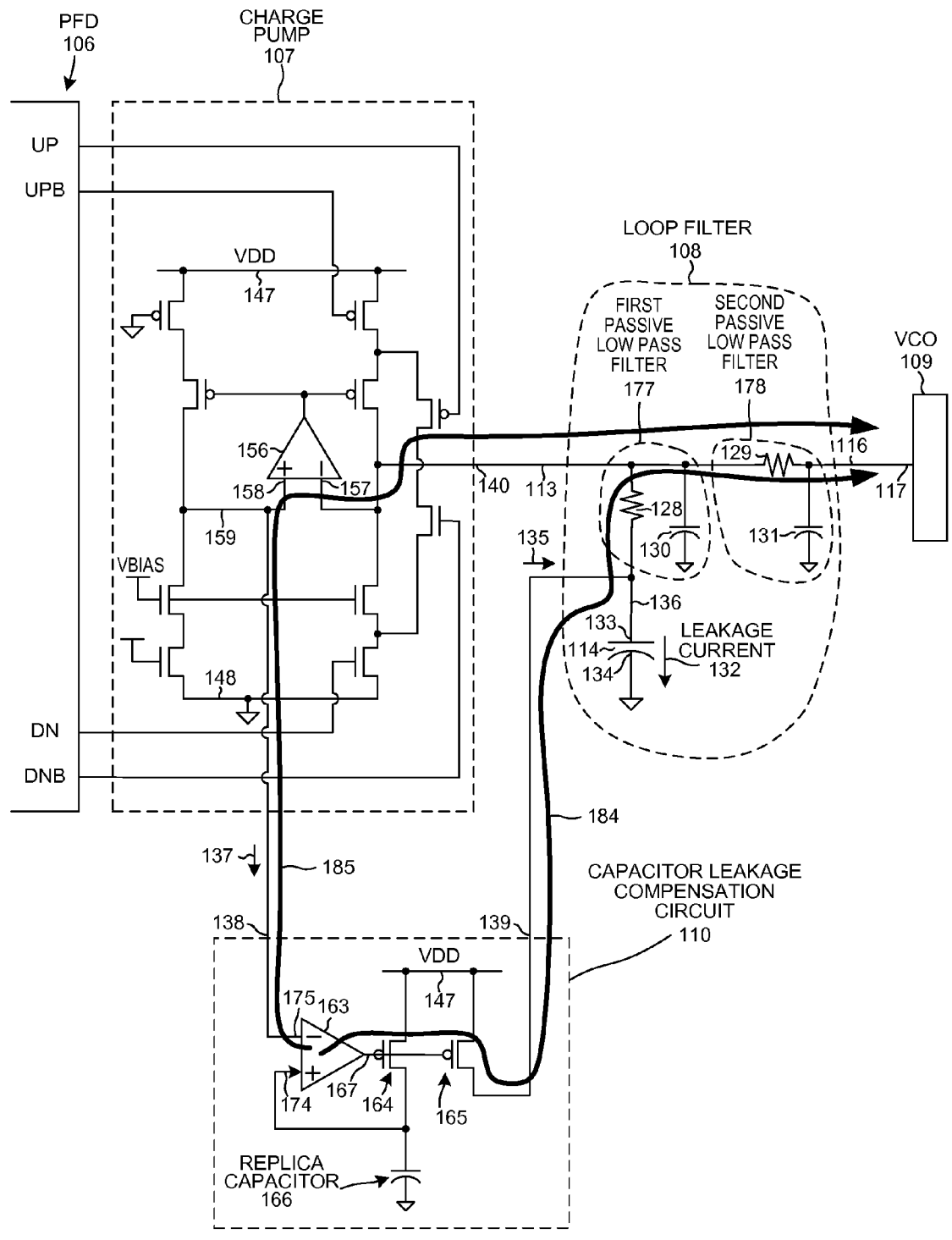
FIG. 4 is a diagram showing two possible paths that noise might take in passing from a noise source in the capacitor leakage compensation circuit to the input lead of the VCO in the PLL of FIG. 1.

FIG. 4 is a diagram showing two possible paths that noise might take in passing from a noise source in capacitor leakage compensation circuit 110 and passing to the control input lead 117 of VCO 109. Noise may, for example, be generated by the input stage of operational amplifier 163. This noise may appear in the compensation current signal 135 that is output by capacitor leakage compensation circuit 110. In addition, power supply noise from conductor 147 may also be present in the compensation current signal 135 that is output by capacitor leakage compensation circuit 110. Arrow 184 indicates the path such noise would have to take to reach the control input lead 117 of VCO 109. The noise would have to pass through both passive low pass filters 177 and 178. Filters 177 and 178 advantageously attenuate such noise. In the circuit of U.S. Pat. No. 6,956,417, on the other hand, the drain of the current mirror of the leakage compensation circuit is connected directly to the input of the VCO. There is no attenuation of noise by intervening filters. The noise is injected directly onto the input of the VCO.

There is also a second path by which noise from the capacitor leakage compensation circuit 110 may reach the control input lead 117 of the VCO 109. Noise generated in the input stage of operational amplifier 163 may pass out of the inverting input lead 175 of the sensing operational amplifier and may pass along the path indicated by arrow 185 to the control input lead 117 of VCO 109. Both the operational amplifier 156 and the second passive low pass filter 178 are in this path 185. Circuitry in this path 185, including operational amplifier 156 and second low pass filter 178, provide a desirable measure of attenuation to help prevent noise on CPOVRN node 159 from reaching the VCO input. Rather than the inverting input lead of the sensing operational amplifier being directly connected to the input of the VCO as in the prior art of U.S. Pat. No. 6,963,232, the inverting input lead 175 of sensing operational amplifier 163 in the circuit of FIG. 4 is connected to CPOVRN node 159.

The circuit of FIG. 3 is similar to the circuit of U.S. Pat. No. 6,956,417 in that it uses a passive loop filter, but it is different in that its compensation circuits (both its input and output paths) are filtered before its noise is coupled to the VCO input. The circuit of FIG. 3 is similar to the circuit of U.S. Pat. No. 6,963,232 in that the output of the compensation circuit is filtered, but it is different in that its output is filtered more efficiently (in the circuit of U.S. Pat. No. 6,956,417 the output of the compensation circuit does not see explicit low pass filtering), its input noise is filtered, and it involves a passive filter (the circuit of U.S. Pat. No. 6,963,232 has an active filter).

Figure 5:
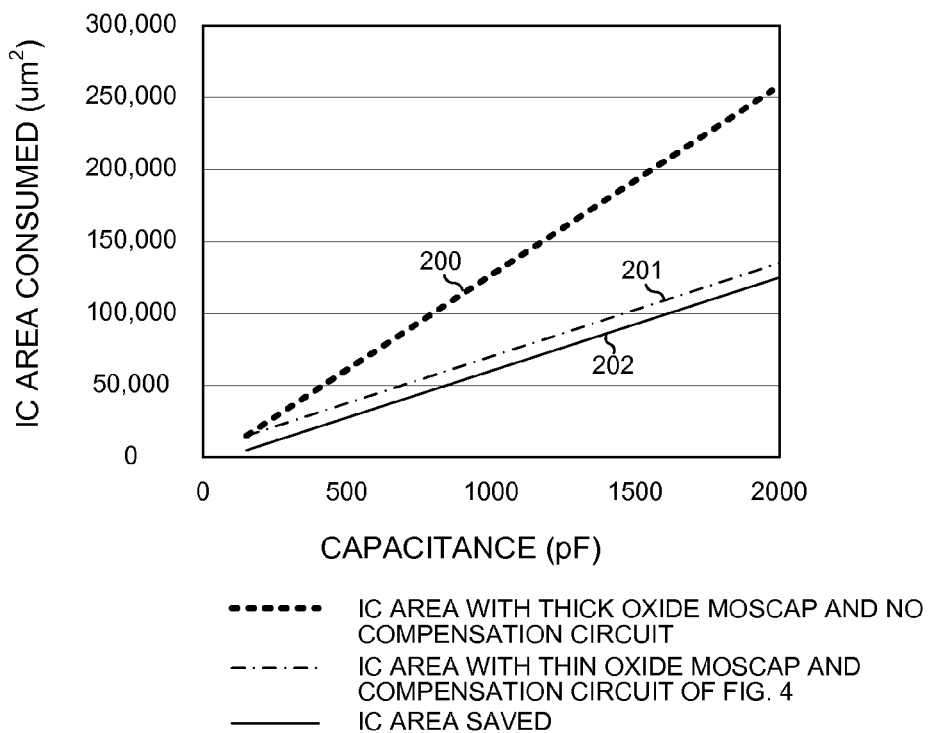
FIG. 5 is a diagram that compares the amount of integrated circuit area occupied when a capacitor of a loop filter is realized as a thick oxide MOSCAP without any capacitor leakage compensation circuit, and when the capacitor is realized as a leaky thin oxide MOSCAP with the capacitor leakage compensation circuit of FIG. 2.

FIG. 5 is a diagram that compares the amount of integrated circuit area occupied when capacitor 114 is realized as a thick oxide MOSCAP without any capacitor leakage compensation circuit, and when capacitor 114 is realized as a thin oxide MOSCAP with the capacitor leakage compensation circuit 110 of FIG. 2. Line 200 indicates the amount of integrated circuit area consumed when capacitor 114 is realized as a thick oxide MOSCAP and if no capacitor leakage compensation circuit is provided. Line 201 indicates the total integrated circuit area consumed if capacitor 114 is realized as a thin oxide MOSCAP and if the capacitor leakage compensation circuit 110 of FIG. 2 is provided, where N=21, and where the capacitance of capacitor 114 is 500 pF. In this situation, capacitor leakage compensation circuit 110 occupies an integrated circuit area of about 70 microns by 70 microns. Current consumption of the capacitor leakage compensation circuit 110 is fifty microamperes. Average leakage current through resistor 128 is about 0.03 microamperes. Phase margin is 89 degrees (60 degrees to 127 degrees over PVT). Low frequency loop gain is 25 dB (2 dB to 53 dB over PVT). The 2 dB loop gain value is for a slow process corner where leakage is smallest, whereas the 53 dB loop gain value is for a fast process corner where leakage is greater. Having a small loop gain when the percentage leakage correction error is larger is okay because the actual leakage current value is small. If the capacitor leakage compensation circuit 110 were disabled, then leakage current 132 as indicated by average current flow through resistor 128 would be about 4.5 microamperes.

Line 202 indicates the difference in integrated circuit area between: 1) using a thick oxide MOSCAP for capacitor 114 without any capacitor leakage compensation circuit, and 2) using a thin oxide MOSCAP for capacitor 114 with the capacitor leakage compensation circuit of FIG. 2. In the examples of FIG. 5, each MOSCAP considered actually includes a sidewall capacitance RTMOM capacitor structure disposed directly above the MOSCAP structure, where the sidewall capacitance provided by the additional RTMOM capacitor structure is between closely spaced columns of metal involving metal layers one through four.

Figure 6:
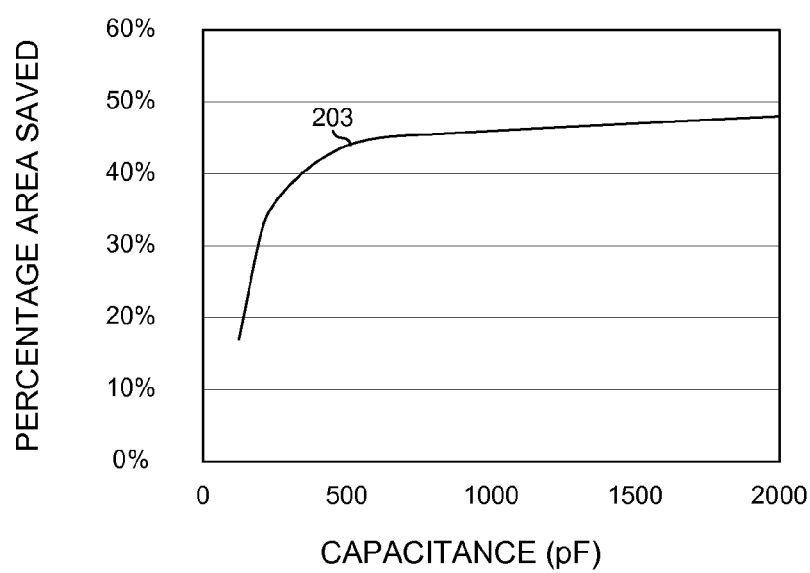
FIG. 6 is a diagram that shows the percentage area savings realized in using the capacitor leakage compensation circuit of FIG. 2 as compared to using a thick oxide MOSCAP and no capacitor leakage compensation circuit.

FIG. 6 is a diagram that shows the percentage area savings realized in using the capacitor leakage compensation circuit 110 of FIG. 2 as compared to using a thick oxide MOSCAP and no capacitor leakage compensation circuit. Line 203 indicates that the percentage area saved is small for small values of capacitor 114. This is so because there is a relatively fixed amount of integrated circuit area required to realize the capacitor leakage compensation circuit 110, regardless of the size of capacitor 114.

Figure 7:
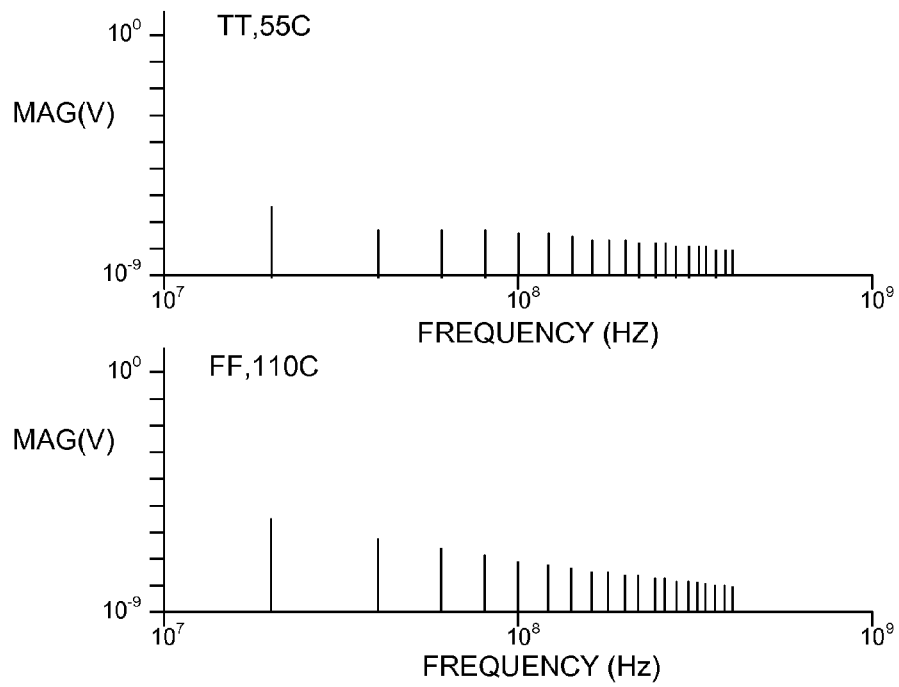
FIG. 7 is a diagram that shows the frequency components of VTUNE in a case where the PLL is an implementation using a thick oxide MOSCAP with no capacitor leakage compensation circuit.

FIG. 7 is a diagram that shows the frequency components of VTUNE, where the PLL is in steady state, where FREF signal 101 is 20 MHz, where the PLL is an implementation using a thick oxide MOSCAP for capacitor 114, and where there is no capacitor leakage compensation circuit. Ideally VTUNE would be a DC signal having no nonzero frequency components, but in reality there are higher frequency components due to ripple in the VTUNE signal as a consequence of capacitor leakage and other factors. FIG. 7 shows that the volt peak (half the peak-to-peak voltage of the ripple) of signal VTUNE at 20 MHz is minus 117 dBVp worst case.

Figure 8:
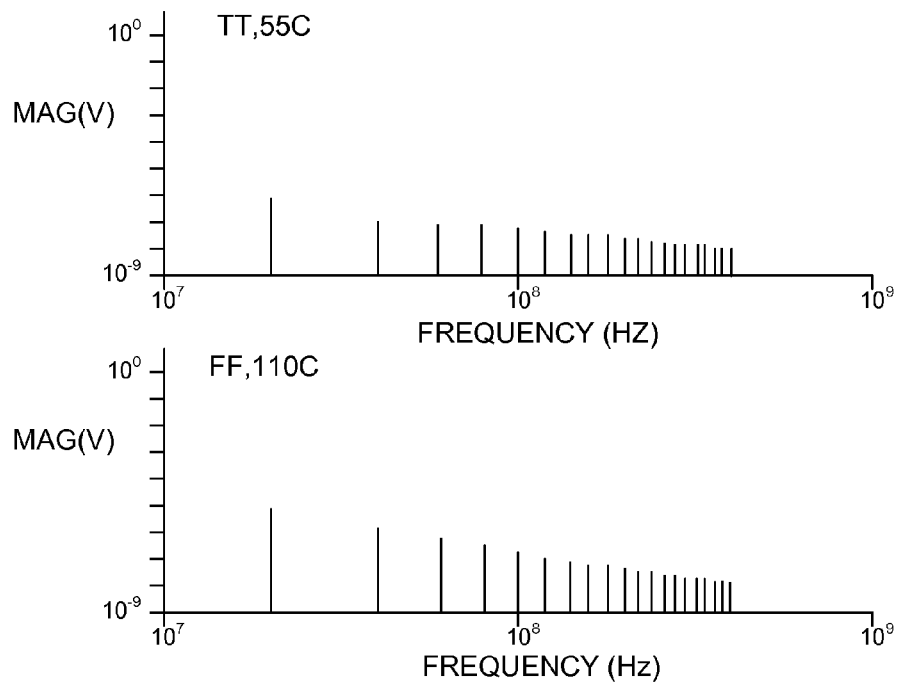
FIG. 8 is a diagram that shows the frequency components of VTUNE in a case where the PLL is the PLL of FIG. 1 and involves the capacitor leakage compensation circuit of FIG. 2.

FIG. 8 is a diagram that shows the frequency components of VTUNE when the PLL of FIG. 1 is operating in steady state, where FREF signal 101 is 20 MHz. The volt peak (half the peak-to-peak voltage of the ripple) of signal VTUNE at 20 MHz is minus 112 dBVp worst case. Accordingly, FIG. 8 indicates that there is slightly more ripple in VTUNE in the PLL of FIG. 1 than in the case of using a thick oxide MOSCAP for capacitor 114 as indicated in FIG. 7, but the increased amount of ripple is slight.

Figure 9:
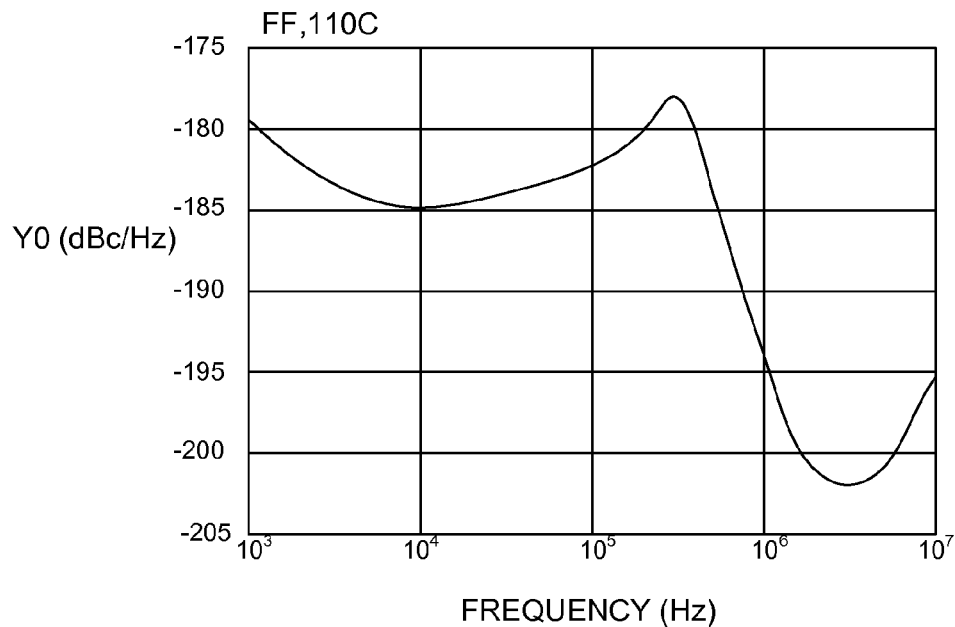
FIG. 9 is a diagram that shows the closed loop phase noise in the VCO output signal of a PLL, where the PLL uses a thick oxide MOSCAP capacitor and has no capacitor leakage compensation circuit.

FIG. 9 is a diagram that shows the closed loop phase noise in the VCO output signal of a PLL, where the PLL uses a thick oxide MOSCAP for capacitor 114, and where the PLL has no capacitor leakage compensation circuit.

Figure 10:
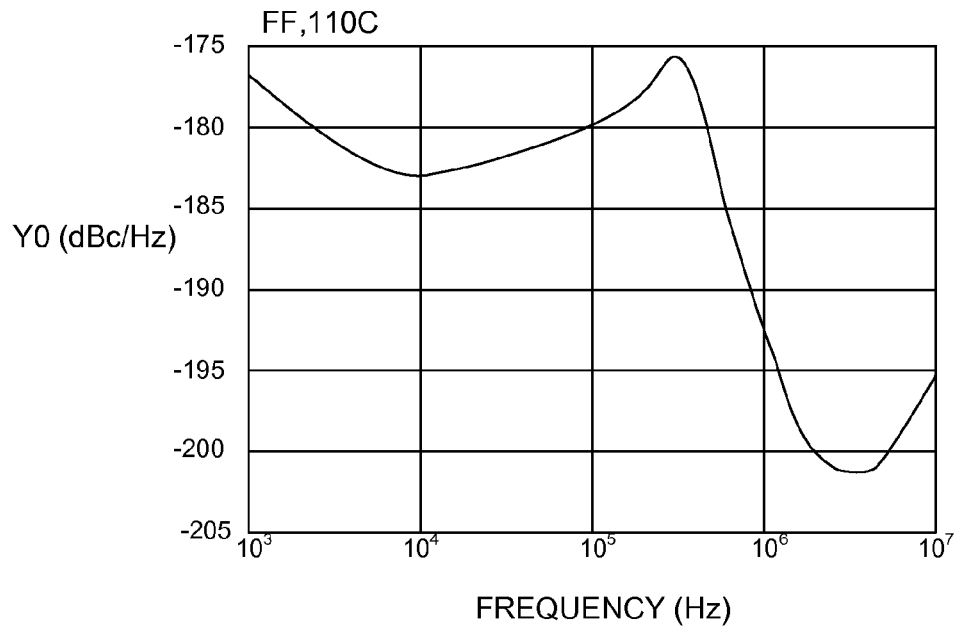
FIG. 10 is a diagram that shows the closed loop phase noise in the VCO output signal of the PLL of FIG. 1, where the PLL uses a thin oxide MOSCAP and involves the capacitor leakage compensation circuit of FIG. 2.

FIG. 10 is a diagram that shows the closed loop phase noise in the VCO output signal VCO_OUT 103 of the PLL of FIG. 1, where the PLL 100 uses a thin oxide MOSCAP for capacitor 114, and where the PLL 100 involves the capacitor leakage compensation circuit 110 of FIG. 2. The phase noise indicated in FIG. 10 is only slightly worse than the phase noise indicated in FIG. 9. The comparative data presented in the graphs of FIG. 9 and FIG. 10 was obtained by simulating PLL circuits with noiseless VCOs. The small amount of phase noise indicated in both FIG. 9 and FIG. 10 is so small that in a real PLL the noise generated by the VCO would dominate. Accordingly, adding the capacitor leakage compensation circuit 110 of FIG. 2 to the PLL does not increase overall PLL phase noise.

Figure 11:
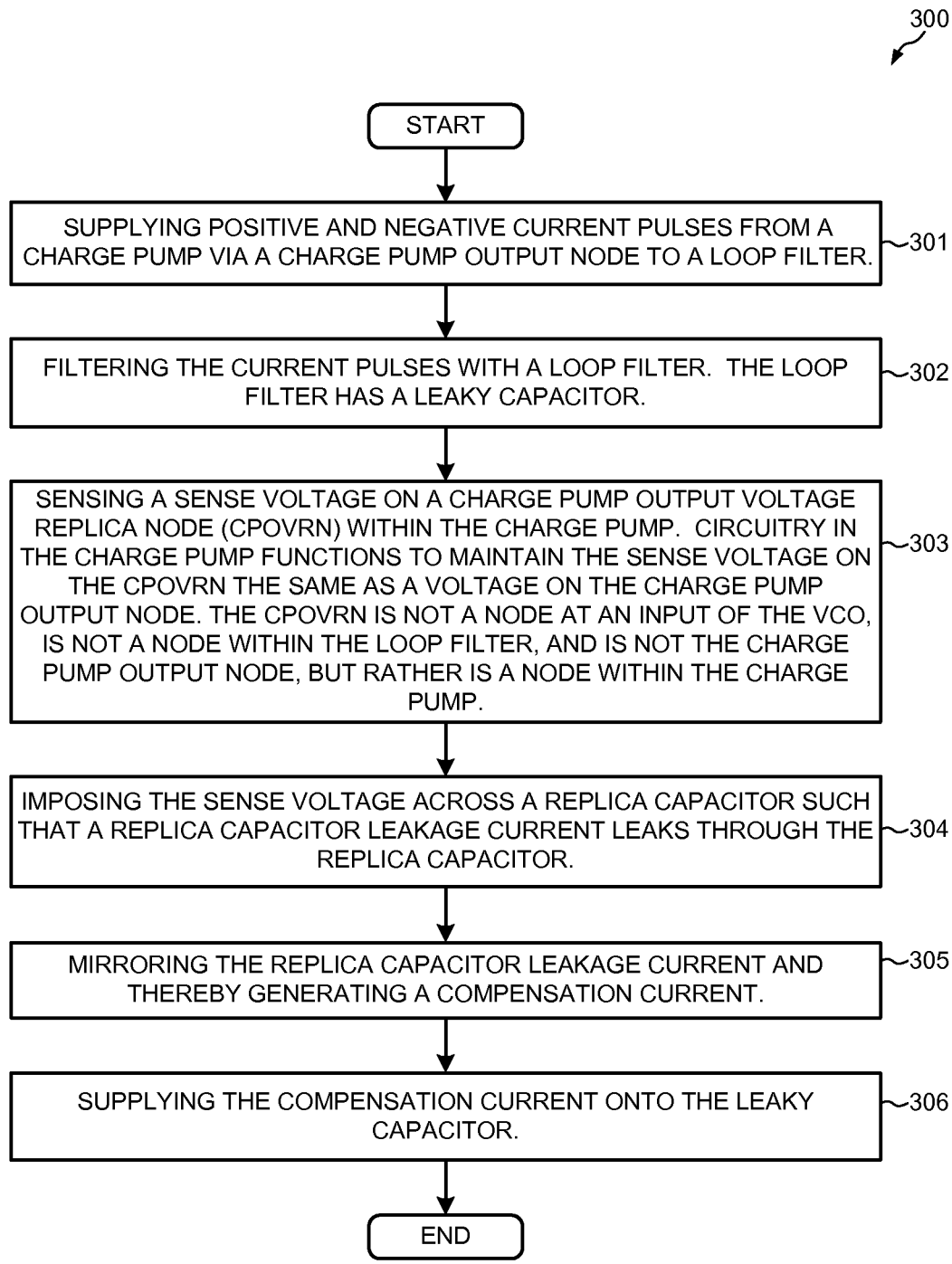
FIG. 11 is a flowchart of a method in accordance with one novel aspect.

FIG. 11 is a flowchart of a method 300 in accordance with one novel aspect.

Positive current pulses and negative current pulses are supplied (step 301) from a charge pump via a charge pump output node to a loop filter. In one example, the positive current pulses and the negative current pulses together are the current signal 112 denoted ICP in FIG. 2. The current pulses are filtered (step 302) with a loop filter, where the loop filter includes a leaky capacitor. In one example, the loop filter is loop filter 108 of FIG. 2, and the leaky capacitor is capacitor 114 of FIG. 2. A sense voltage on a "Charge Pump Output Voltage Replica Node" (CPOVRN) within the charge pump is sensed (step 303). In one example, the sense voltage is sense voltage 137 of FIG. 2 and the CPOVRN is node 159 in FIG. 2. The sense voltage is sensed by the operational amplifier 163 of the capacitor leakage compensation circuit 110 of FIG. 2. Circuitry in the charge pump functions to maintain the sense voltage on the CPOVRN the same as a voltage on the charge pump output node. In one example, the circuitry that maintains the voltage on CPOVRN the same as the voltage on the charge pump output node is operational amplifier 156. The sense voltage is imposed (step 304) across a replica capacitor. A replica capacitor leakage current leaks through the replica capacitor. In one example, the replica capacitor is capacitor 166 of FIG. 2. The replica capacitor leakage current is mirrored (step 305) thereby generating a compensation current. In one example, the mirroring is performed by the current mirror of FIG. 2 involving transistors 164 and 165. The compensation current is supplied (step 306) onto the leaky capacitor. In one example, the compensation current is current 135 of FIG. 2. This current 135 is supplied onto node 136 in FIG. 2. In one example, steps 303-306 are performed by the capacitor leakage compensation circuit 110 of FIG. 2. Although the steps of the method of FIG. 11 are illustrated as being in a flowchart, the operations of the steps are actually all being performed simultaneously.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A circuit comprising:
   a loop filter comprising a capacitor;
   a charge pump comprising a charge pump output node, a first operational amplifier, and a Charge Pump Output Voltage Replica Node (CPOVRN), wherein the charge pump output node is coupled to the loop filter, and wherein the CPOVRN is directly coupled to a high impedance noninverting input lead of the first operational amplifier; and
   a capacitor leakage compensation circuit having a second operational amplifier and an output node, wherein the second operational amplifier comprises a noninverting input lead, an inverting input lead, and an output lead, wherein the inverting input lead is directly coupled to the CPOVRN, wherein the noninverting input lead is directly coupled to a replica capacitor and the output node of the capacitor leakage compensation circuit is coupled to the capacitor of the loop filter, wherein the capacitor leakage compensation circuit senses a sense voltage present on the CPOVRN and imposes this sense voltage across the replica capacitor, wherein the capacitor leakage compensation circuit supplies a compensation current onto a plate of the capacitor, and wherein the sense voltage across the replica capacitor is substantially identical to a voltage across the capacitor.

2. The circuit of claim 1, wherein the charge pump comprises an output portion and a current control portion, wherein the CPOVRN is a node within the current control portion, wherein the output portion supplies positive current pulses and negative current pulses via the charge pump output node to the loop filter, and wherein the current control portion controls the output portion such that the positive current pulses are of substantially the same magnitude as the negative current pulses.

3. The circuit of claim 2, wherein the capacitor leakage compensation circuit further comprises:
   a first transistor having a gate, a source, and a drain, wherein the drain is coupled to the replica capacitor;
   a second transistor having a gate, a source, and a drain, wherein the drain is coupled to the plate of the capacitor of the loop filter; and
   the second operational amplifier, wherein the output lead of the second operational amplifier is coupled to the gate of the first transistor and is coupled to the gate of the second transistor.

4. The circuit of claim 2, wherein the loop filter further comprises:
   a resistor coupled between the charge pump output node and the plate of the capacitor.

5. The circuit of claim 2, wherein the loop filter further comprises:
   a passive low pass filter coupled between the charge pump output node and an input lead of a Voltage Controlled Oscillator (VCO).

6. The circuit of claim 2, wherein the current control portion of the charge pump comprises the first operational amplifier, wherein the first operational amplifier of the current control portion has a first input lead and a second input lead, wherein the first input lead is coupled to the charge pump output node, and wherein the second input lead comprises the high impedance noninverting input lead of the first operational amplifier.

7. The circuit of claim 2, wherein the plate of the capacitor of the loop filter is coupled to an input lead of a Voltage Controlled Oscillator (VCO) via at least one passive low pass filter.

8. The circuit of claim 2, wherein the plate of the capacitor of the loop filter is coupled to an input lead of a Voltage Controlled Oscillator (VCO) via two series-connected passive low pass filters.

9. The circuit of claim 2, wherein the current control portion of the charge pump includes a first P-channel transistor, a second P-channel transistor, and first N-channel transistor, and a second N-channel transistor, wherein the first and second P-channel transistors and the first and second N-channel transistors are coupled together in series to establish a current path from a supply voltage conductor, through the CPOVRN, and to a ground conductor.

10. The circuit of claim 9, wherein a gate of the first P-channel transistor is grounded, wherein a supply voltage is present on a gate of the second N-channel transistor, wherein a bias voltage is present on a gate of the first N-channel transistor, and wherein a drain of the first N-channel transistor is coupled to the CPOVRN.

11. The circuit of claim 10, wherein the current control portion further comprises the first operational amplifier, wherein the first operational amplifier of the current control portion has an output lead coupled to a gate of the second P-channel transistor, a first input lead coupled to the charge pump output node, and a second input lead that comprises the high impedance noninverting input lead of the first operational amplifier.

12. The circuit of claim 1, wherein the loop filter comprises only passive circuitry.

13. The circuit of claim 1, wherein the input node of the capacitor leakage compensation circuit is not directly coupled to a voltage controlled oscillator (VCO).

14. The circuit of claim 1, wherein the input node of the capacitor leakage compensation circuit is not directly coupled to the capacitor.

15. The circuit of claim 1, wherein the input node of the capacitor leakage compensation circuit is not directly coupled to the charge pump output node.

16. A method comprising:
(a) supplying positive current pulses and negative current pulses from a charge pump via a charge pump output node to a loop filter, wherein the charge pump comprises a first operational amplifier;
(b) filtering the positive current pulses and the negative current pulses using the loop filter, wherein the loop filter comprises a capacitor;
(c) sensing a sense voltage present on a Charge Pump Output Voltage Replica Node (CPOVRN) within the charge pump, wherein the sense voltage is received onto an input node of a capacitor leakage compensation circuit, wherein the capacitor leakage compensation circuit comprises a second operational amplifier comprising a noninverting input lead, an inverting input lead, and an output lead, wherein the inverting input lead is directly coupled to the CPOVRN, wherein the noninverting input lead is directly coupled to a replica capacitor, and wherein the CPOVRN is directly coupled to a high impedance noninverting input lead of the first operational amplifier;
(d) imposing the sense voltage across the replica capacitor such that a replica current leaks through the replica capacitor, wherein the replica capacitor is a replica of the capacitor of the loop filter but has a smaller capacitance than the capacitor of the loop filter;
(e) mirroring the replica current and thereby generating a compensation current; and
(f) supplying the compensation current from an output node of the capacitor leakage compensation circuit onto a plate of the capacitor of the loop filter, wherein the output node of the capacitor leakage compensation circuit is coupled to the plate of the capacitor.

17. The method of claim 16, wherein the second operational amplifier performs the sensing of (c) by receiving the sense voltage onto the inverting input lead of the second operational amplifier, wherein the output lead of the second operational amplifier is coupled to a current mirror, and wherein the current mirror generates the compensation current.

18. The method of claim 17, further comprising:
(g) using the first operational amplifier to maintain the sense voltage on the CPOVRN to be substantially equal to a voltage present on the charge pump output node, wherein an inverting input lead of the first operational amplifier is coupled to the charge pump output node.

19. The method of claim 18, further comprising:
(h) conducting a current from a supply conductor, through the CPOVRN, and to a ground conductor.

20. The method of claim 16, wherein the loop filter further comprises a resistor coupled between the charge pump output node and the plate of the capacitor of the loop filter.

21. The method of claim 16, wherein the loop filter further comprises two passive low pass filters coupled in series between the plate of the capacitor of the loop filter and an input lead of a Voltage Controlled Oscillator (VCO).

22. The method of claim 16, wherein the charge pump includes a current control portion and an output portion, wherein the method further comprises:
(g) supplying positive current pulses and negative current pulses from the output portion via the charge pump output node to the loop filter; and
(h) controlling the output portion such that the positive current pulses are of the same magnitude as the negative current pulses, wherein the current control portion performs the controlling at least in part by maintaining the sense voltage on the CPOVRN to be substantially identical to a voltage present on the charge pump output node.

23. A circuit comprising:
a loop filter comprising a capacitor;
a charge pump comprising an output portion, a first operational amplifier, and a current control portion, wherein the output portion supplies positive current pulses and negative current pulses via a charge pump output node to the loop filter, and wherein the current control portion controls the output portion such that the positive current pulses are of the same magnitude as the negative current pulses; and
means for sensing a sense voltage present on a Charge Pump Output Voltage Replica Node (CPOVRN) within the current control portion of the charge pump and imposing this sense voltage across a replica capacitor, wherein the means comprises a second operational amplifier that comprises a noninverting input lead, an inverting input lead, and an output lead, wherein the inverting input lead is directly coupled to the CPOVRN, wherein the noninverting input lead is directly coupled to the replica capacitor, wherein the means is also for supplying a compensation current onto a plate of the capacitor such that the sense voltage across the replica capacitor is substantially identical to a voltage across the capacitor, wherein the CPOVRN is directly coupled to a high impedance noninverting input lead of the first operational amplifier, and wherein the means has an input node that is coupled to the CPOVRN and an output node that is coupled to the capacitor.

24. The circuit of claim 23, wherein the current control portion comprises a first P-channel transistor, a second P-channel transistor, a first N-channel transistor, and a second N-channel transistor, wherein the first and second P-channel transistors and the first and second N-channel transistors are coupled together in series to establish a current path from a supply voltage conductor, through the CPOVRN, and to a ground conductor, and wherein the current control portion further comprises the first operational amplifier having a first input lead and a second input lead, wherein the first input lead of the first operational amplifier is coupled to the charge pump output node, and wherein the second input lead comprises the high impedance noninverting input lead of the first operational amplifier.

25. The circuit of claim 23, wherein the loop filter further comprises two passive low pass filters coupled in series between the plate of the capacitor of the loop filter and an input lead of a Voltage Controlled Oscillator (VCO).

26. The circuit of claim 23, wherein the loop filter further comprises a resistor coupled between the plate of the capacitor of the loop filter and the charge pump output node.

* * * * *